United States Patent [19]

Embree et al.

[11] Patent Number: 4,853,655
[45] Date of Patent: Aug. 1, 1989

[54] HIGH FREQUENCY CMOS OSCILLATOR

[75] Inventors: David M. Embree, Hampstead, N.H.; Shawn M. Logan, Andover, Mass.

[73] Assignee: American Telephone and Telegraph Company, AT&T Bell Laboratories, Murray Hill, N.J.

[21] Appl. No.: 126,131

[22] Filed: Nov. 27, 1987

[51] Int. Cl.[4] .............................................. H03B 5/36
[52] U.S. Cl. ........................... 331/116 FG; 331/108 A
[58] Field of Search ........ 331/108 A, 108 R, 116 FE, 331/116 R, 117 FE, 117 R; 307/297; 330/85, 277, 300, 311

[56] References Cited

U.S. PATENT DOCUMENTS

| 4,388,536 | 6/1983 | Peil et al. | 331/116 FE |
|---|---|---|---|
| 4,400,812 | 8/1983 | Clark et al. | 307/285 X |
| 4,405,906 | 9/1983 | Luscher | 331/116 FE |
| 4,700,125 | 10/1987 | Takata et al. | 307/304 X |

Primary Examiner—Eugene R. LaRoche
Assistant Examiner—Robert J. Pascal
Attorney, Agent, or Firm—Joseph A. Cameron

[57] ABSTRACT

Maximum frequency range in a CMOS voltage-controllable crystal oscillator is obtained with a two-stage amplifier with feedback across both stages. The first stage is connected in source-follower configuration to minimize input capacitance, and the second stage provides the needed gain. To eliminate body effect, the source electrode and body of the second stage CMOS device are connected together. A bidirectional voltage limiter connected to a crystal node limits the oscillations to a symmetrical waveform. Changes in effective duty cycle caused by the different triggering levels of diverse logic connected to the oscillator output are compensated for by selectively shifting dc bias to a buffer amplifier.

9 Claims, 1 Drawing Sheet

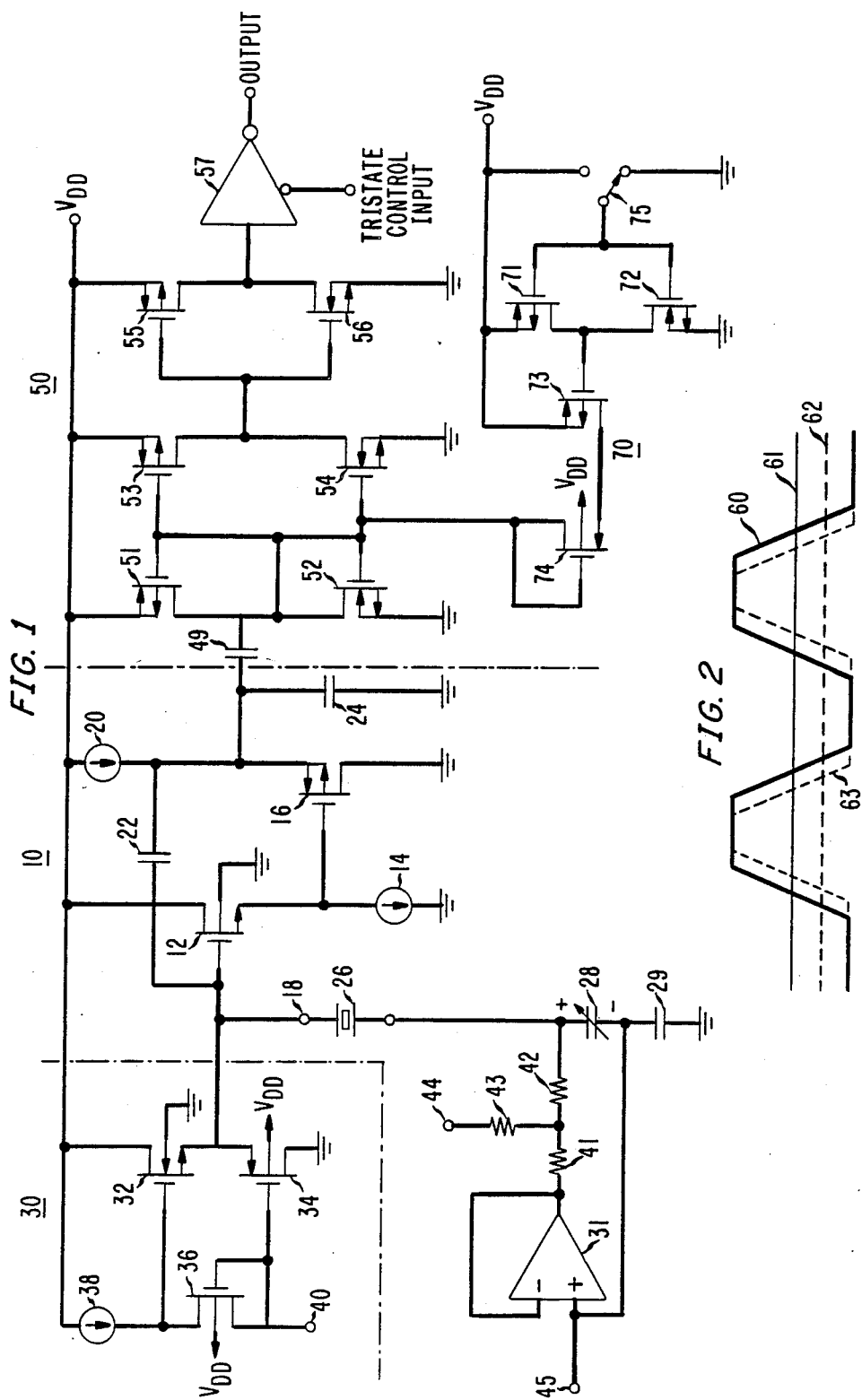

HIGH FREQUENCY CMOS OSCILLATOR

TECHNICAL FIELD

This invention is in the field of electronic oscillators, and more particularly, mini electronic oscillators for manufacture in CMOS technology.

BACKGROUND OF THE INVENTION

Digital communication relies on accurate timing; in this age of high bit rate digital communication, there is a large need for high frequency oscillators to time the high speed digital circuits. Furthermore, because of the degree of miniaturization prevalent in the industry, the need is particularly great for miniature oscillators manufacturable in low cost, very large scale integrated technology (VLSI) such as metal oxide semiconductor (MOS).

For the required accuracy to keep communication circuits synchronized, the oscillators may be controlled by a high Q resonator; common resonators include L-C tank circuits, tuned cavities, quartz crystals, and ceramic resonators. When a voltage controllable oscillator using a high Q resonator is used in a phase locked loop to match one frequency with another, its frequency must be variable over a reasonable range. This combination of requirements has proven hard to meet. The highest frequency at which an oscillator will operate is limited by the gain of the oscillator transistor; likewise, the frequency range through which an oscillator can be pulled is also limited by its gain. Unfortunately, the gain of semiconductor devices manufactured in MOS is low compared, for example, to that of similar size devices in bipolar technology. When the width to length ratio of an MOS device is increased to increase the gain, however, the gate-source and gain-drain capacitances of the device also increase. The resulting increased loading of the oscillator circuit offsets the increase in gain to result in no increase in maximum operating frequency.

Significant further reduction in effective gain of MOS devices is caused by the body effect. Until our invention, therefore, the frequency range of mini oscillators in MOS technology has been severely limited.

An object of this invention is a mini oscillator that is manufacturable in MOS technology and that has a significantly improved frequency range and a high pull range.

When oscillators are used in timing applications for digital circuits, a square wave with a duty cycle close to 50% is desirable to allow equal time for circuit action triggered by either the rising or the falling pulse edge. When oscillators are operated near their maximum frequency, however, the duty cycle is controlled by device parameters that tend to be asymmetrical. Conventional feedback circuitry may be used to force the duty cycle to 50%, but it can severaly limit the oscillator frequency and is often a source of additional phase noise.

A second object of this invention is a high frequency resonator-controlled oscillator with a duty cycle controlled to approximately 50% without substantially limiting the maximum frequency of oscillation.

SUMMARY OF THE INVENTION

An electronic oscillator comprises two amplifying stages having respective CMOS devices of opposite polarity and feedback from the output of the second device to the input of the first device. The first stage has a low gain configuration, providing a low input capacitance, while the second stage provides the needed gain. The body and source electrodes of the second device are connected together to eliminate frequency-limiting body effect.

Approximately 50% duty cycle can be assured without substantial frequency reduction by a bidirectional voltage limiter connected to the resonator node to limit the oscillations to a symmetrical waveform.

Changes in duty cycle caused by the different triggering levels of diverse logic connected to the oscillator output can be compensated for by selectable shifts in bias to a buffer amplifier.

BRIEF DESCRIPTION OF THE DRAWING

FIG. 1 is a schematic diagram of a voltage controllable crystal oscillator in CMOS technology that embodies the invention.

FIG. 2 is an output waveform useful in explaining a duty cycle control feature of the invention.

DETAILED DESCRIPTION

For convenience, the oscillator of FIG. 1 may be considered in three sections—an oscillating section 10, a voltage limiting section 30, and an amplifying section 50.

In the oscillating section 10, an N-channel CMOS device 12 has its drain electrode connected to a source of operating voltage $V_{DD}$ and its source electrode connected through a current source 14 to ground. The gate electrode of device 12 is connected to a resonator node 18. A P-channel CMOS device 16 has its drain electrode connected to ground and its source electrode connected through a second current source 20 to source $V_{DD}$. A feedback capacitor 22 connects the gate of device 12 with the source electrode of device 16, and a second feedback capacitor 24 connects the source electrode of device 16 to ground.

The body of device 12 is connected to ground, while the body of device 16 is connected to its source electrode. To complete the oscillating section circuit, the series combination of a crystal resonator 26, a varactor 28 and a fixed capacitor 29 is connected between resonator node 18 and ground.

An oscillator may be considered an amplifier with feedback. The amplifier of oscillator section 10 is a two-stage amplifier including both devices 12 and 16. Capacitors 22 and 24 provide the necessary feedback over both stages to sustain oscillations.

In complementary metal oxide semiconductor (CMOS) construction many insulated gate transistors, of both P-channel and N-channel types, are formed in a semiconductor substrate by well known methods. For devices of a channel type opposite to that of the substrate, the device body is the substrate. That is, for example, if the substrate is P-type silicon, N-type regions are formed in it to provide the source and drain, respectively, of an N-channel type device. The body of such devices is the P-type substrate itself, which is generally connected to circuit ground. For devices of a channel type the same as that of the substrate, on the other hand, a region of opposite type material, or "tub" is formed within the substrate to become the body of the device. For example, small P-type regions formed within a larger N-type tub in a P-type substrate become the source and drain of a P-channel type device. The tubs are normally connected to the operating voltage source.

The normal connection of substrate to ground and the tubs to the operating voltage source serves to reverse bias the source-body diode and allow the gate to control the source-drain impedance. It provides other effects, however, known as body effect which limit the gain of the device and the frequency of the oscillator. Our invention overcomes this limitation.

The schematic diagram of FIG. 1 presumes a substrate of P-type semiconductor material, although the invention is not so limited.

It will be noted that while the body of device 12 is connected to ground in typical CMOS fashion, that of device 16 is connected to the source electrode rather than $V_{DD}$, in accordance with the invention.

Also in accordance with the invention, device 12 is connected in a source follower configuration with a correspondingly small input capacitance. It has, of course, very little gain. Device 16, on the other hand, may be a relatively large CMOS device with a correspondingly large gain. Since device 16 is formed in a tub, its body may be connected to its source as shown. This eliminates the body effect and its corresponding reduction in gain.

The amplifier of oscillating section 10 therefore has a small input capacitance contributed by the first stage and a large gain without significant body effect, contributed, by the second state. It will be recognized by those skilled in the art that these are the requirements for high frequency operation. It will also be recognized that the invention is not limited to the Colpitts oscillator variation shown; the frequency range of other oscillator types may be extended by application of the same principle. The optimum ratio of sizes of devices depends of course, upon the particular characteristics produced by the manufacturing process. We have found a ratio of 5:1 to operate very satisfactorily, yielding a maximum oscillating frequency of approximately 80 MHz. Current sources 14 and 20 are designed in accordance with standard CMOS procedure to maximize over-all amplifier gain.

As previously mentioned, the embodiment of FIG. 1 is shown as a voltage-controllable crystal oscillator, although the invention is not limited thereto. Varactor control networks, useful to change the varactor capacitance and thereby the frquency for phase locked loop application are well known in the art. A typical such network might include a unity gain amplifier 31, a voltage divider comprising 3 resistors, 41, 42 and 43, and a source of reference voltage 44. The amplifier serves to buffer the control voltage applied to its input terminal 45. The reference voltage from source 44 and the voltage divider set the varactor voltage for maximum capacitance shift according to the varactor characteristic. Since no dc current flows in the circuit, the varactor voltage may be defined as $$V_{var} = \frac{R_{41}}{R_{41} + R_{43}} (V_{44} - V_{control})$$

where $V_{control}$ is the voltage applied to terminal 45, and $V_{44}$ is the reference voltage from source 44. Although varactors formed by other processes may be satisfactorily used to perform this invention, a particularly useful one is desribed in our concurrently filed co-pending application Ser. No. 126,132 titled "Voltage Controlled Variable Capacitor".

It is manufacturable in CMOS and therefore is integratable on the same chip for cost savings and optimal miniaturization.

Where fixed frequency operation is desired, resonator 26 may be connected between node 18 and either $V_{DD}$ or ground.

Normally, a resonator controlled oscillator running at its maximum frequency produces a rectangular waveform. The semiconductor devices are driven between their linear regions and cutoff, and the output voltage swings almost the full range of the supply voltage. Such operation generally results in a non-symmetrical output waveform that is not convenient for digital circuit timing purposes.

In accordance with another aspect of the invention, voltage limiting section 30 of the embodiment of FIG. 1 limits the excursions at resonator node 18 to keep devices 12 and 16 in their saturated regions and provide a symmetrical waveform.

In section 30, the drain-source path of an N-channel device 32 is connected in series with the source-drain path of a P-channel device 34 across the source of operating voltage $V_{DD}$. The source electrodes of devices 32 and 34 are connected together and to resonator node 18. A diode-connected P-channel device 36 has its source electrode connected through a current source 38 to voltage source $V_{DD}$ and its drain and gate electrodes connected to a source of reference voltage 40. The gate electrode of device 34 is connected to voltage reference source 40, and the gate electrode of device 32 is connected to current source 38.

Operation of the limiter may be explained as follows:

Since the gate electrode of device 34 is connected to voltage reference source 40, and the source electrode is connected to resonator node 18, device 34 conducts whenever the voltage at node 18 is more than the threshold voltage above reference voltage 40. Similarly, device 32 conducts whenever the voltage at its source electrode is less than the threshold voltage below its gate voltage. Since forward biased diode 36 operates at a voltage approximately equal to the threshold voltage of device 32, device 32 conducts whenever the voltage at node 18 drops below approximately reference voltage 40. Since resonator 26 is quickly loaded by even small currents, the limiter restricts the voltage at node 18 to a minimum of the reference voltage and a maximum of the diode voltage greater than the reference voltage. This prevents both devices 12 and 16 of the oscillator section from leaving the saturated mode of operation and thereby prevents discontinuities in the waveform and insures waveform symmetry and 50% duty cycle.

Voltage reference 40 is therefore chosen to set the quiescent voltage of node 18 and current source 38 to bias device 36 at a stable conducting point.

When a varactor is used to pull the oscillator frequency, voltage reference 40 may be derived from the varactor control voltage by well known voltage divider methods.

A low level CMOS oscillator needs amplification to provide a useful output signal and buffering to prevent the load from affecting its operation. These are major functions of amplifying section 50 of the embodiment of FIG. 1. The particular design of section 50, however, can also preserve the symmetry of the waveform, and therefore the duty cycle, without sacrificing operating frequency.

Section 50 may advantageously comprise several pairs of complementary devices, each pair having its source-drain paths connected in series across supply voltage $V_{DD}$, and forming an inverting amplifying stage. To preserve the 50% duty cycle generated by the symmetrical oscillation, however, the zero signal bias point for each stage must be approximately $V_{DD}/2$, and the threshold voltages must remain almost constant for each successive stage. Since the oscillating section output signal is connected via a coupling capacitor 49, the bias may be set initially by a first pair of complementary devices 51 and 52 connected as diodes. The devices are designed according to standard MOS practice to produce complementary characteristics. In order to maintain constant threshold voltages, each succeeding pair of complementary devices, e.g., 53,54 and 55,56 must be closely matched to devices 51 and 52, respectively. The matching is accomplished by using the same multiple of device width-to-length ratio for the devices in each pair. That is, if the width-to-length ratio of device 53 is 10.6 times the width-to-length ratio of device 51, that of device 54 should be 10.6 times that of device 52, within a few percent. The same is true of each succeeding stage, although the ratio may be different for each stage. The number of amplifying stages may be chosen to suit the needs of the particular application. Additionally, they may terminate in a tristate output buffer 57 to allow the timing signal to be turned on and off without affecting the operation of the oscillating section.

As an additional feature of the invention, a bias changing circuit 70 may be connected to the gates of devices 53 and 54 to suply an approximate 50% duty cycle timing waveform to loads of diverse logic types. When a symmetrical timing signal is operated at near maximum frequency into a load, the rise and fall times of the waveform may consume a considerable part of the cycle. The result is a trapezoidal waveform similar to solid curve 60 of FIG. 2. If the load happens to be a CMOS circuit, the load circuit triggering level would typically be approximately $V_{DD}/2$, shown as level 61 on FIG. 2. At this triggering level, it can be seen that the effective duty cycle of waveform 60 is indeed about 50%. If the load circuit is transistor-transistor logic (TTL), on the other hand, its triggering level is much lower, typically 1.4 volts. This level is represented by dotted line 62. It can be seen by the intersections of line 62 with waveform 60, that the effective duty cycle with a TTL load is far from 50%, and therefore not as useful. Bias shifting circuit 70 provides a switchable correction. Circuit 70 may comprise a first pair of complementary devices 71 and 72 having their drains connected together and their drain-source path connected between $V_{DD}$ and ground. A pair of P-channel devices, 73 and 74 have their source-drain paths connected in series between $V_{DD}$ and the gates of devices 53 and 54. Device 74 is diode-connected; the gate of device 73 is connected to the drains of devices 71 and 72; and the gates of devices 71 and 72 are connected through a switch 75 to $V_{DD}$ or ground.

Circuit 70 operates as follows:

When switch 75 is connected to ground, device 72 turns off, and device 71 turns on. This turns device 73 off, and the biasing of amplifying circuit 50 is unaffected. Waveform 60 is the effective output, ideal for a CMOS load. When switch 75 is connected to $V_{DD}$, on the other hand, device 71 turns off, and device 72 turns on. This turns on device 73, and the input dc voltage of amplifying section 50 is raised. With an over-all inverting nature of the combination of amplifying and buffer stages, the output waveform is shifted to dwell longer near ground, as shown in dotted waveform 63 of FIG. 2. The intersections of dotted waveform 63 with dotted threshold level 62 show that a 50% duty cycle may be thus established for a TTL load. It is worth noting that bias shifting circuit 70 should be connected to an early amplifier stage where the oscillator signal still has appreciable rise and fall time; it would have much less effect on duty cycle at a near-square wave stage.

We have thus described a mini oscillator circuit, manufacturable in CMOS technology, that has a high frequency range at an approximate 50% duty cycle, which is compensated for load logic types. It will be evident to those skilled in the art that many variations of the particular circuit described can be made without departing from the spirit or the scope of our invention.

What is claimed is:

1. An electronic oscillator comprising:
   a first amplifying stage having a first CMOS transistor;
   a second amplifying stage having a second transistor of opposite polarity from said first CMOS transistor; and feedback means connected between the output of said second stage and the input of said first stage;
   characterized in that said first stage is connected in source follower configuration; and
   the gain of said second stage is substantially greater than that of said first stage.

2. An oscillator, as in claim 1, wherein said second transistor is a CMOS device having its body and source electrodes connected together to eliminate body effect.

3. An electronic oscillator as in claim 2 wherein the substrate of said transistors is P-type material and said second transistor is a P-channel device within an N tube in said substrate.

4. An electronic oscillator as in claim 1 further comprising a resonator node connected to said input of said first CMOS transistor for connection to a resonator to control the frequency of oscillation.

5. An electronic oscillator as in claim 4 further comprising a crystal resonator connected to said resonator node; and
   CMOS voltage variable capacitance means connected to said crystal resonator to form an integrated voltage-controllable crystal oscillator.

6. An electronic oscillator comprising:
   first and second voltage terminals for connection to a source of operating voltage;
   a first amplifying stage comprising a first current source connected to said first voltage terminal and a first CMOS amplifying device having a drain electrode connected to said second voltage terminal, a source electrode connected to said first current source and a gate electrode;
   a second amplifying stage comprising a second current source connected to said second voltage terminal and a second CMOS device of opposite polarity from said first CMOS device;
   said second CMOS device having a drain electrode connected to said first voltage terminal, a gate electrode connected to said first device source electrode, and a source electrode connected to said second current source; and feedback means connected between the source electrode of said second device and the gate electrode of said first device;

the gain of said second stage being substantially greater than that of said first stage; and the body and source electrode of said second device being connected together to eliminate body effect.

7. An electronic oscillator as in claim 6 further comprising a resonator node connected to said first CMOS amplifying device gate electrode for connection to a resonator to control the frequency of oscillation, and wherein said voltage limiting means comprises third and fourth CMOS devices of contrasting polarity having their drain electrodes connected to said first and second voltage terminals, respectively, and their source electrodes connected together to said resonator node;

diode means connected between the respective gate electrodes of said third and fourth devices;

a third current source connected between said first voltage terminal and the gate electrode of said third device; and a source of reference voltage connected to the gate electrode of said fourth device.

8. An electronic oscillator comprising:

a first amplifying stage having a first CMOS device;

a second amplifying stage having a second CMOS device of opposite polarity from said first CMOS device;

feedback means connected between the output of said second stage and the input of said first stage; and a resonator node connected to said first stage input for connection to a resonator to control the frequency of oscillation; characterized in that the gain of said second stage is substantially greater than that of said first stage;

the body and source electrodes of said second stage are connected together to eliminate body effect; and said oscillator further comprises bidirectional voltage limiting means connected to said resonator node to provide waveform symmetry at said second amplifying stage.

9. An electronic oscillator as in claim 8 further comprising buffer amplifier means connected to the output of said second CMOS amplifying device; and bias shifting means connected to said buffer amplifier means for selectively altering the buffer amplifier means output waveform to compensate for a change in duty cycle caused by a change in desired triggering level at the buffer amplifier means output.

* * * * *